United States Patent
Schunk et al.

(10) Patent No.: US 8,686,382 B2
(45) Date of Patent: Apr. 1, 2014

(54) OPTO-ISOLATOR THAT USES A NONTRANSPARENT HOLLOW TUBE AS THE OPTICAL WAVEGUIDE EXTENDING BETWEEN THE TRANSMITTER AND RECEIVER MODULES OF THE OPTO-ISOLATOR

(75) Inventors: Nikolaus W. Schunk, Maxhuette-Haidhof (DE); Joerg Meier, Nuremberg (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 350 days.

(21) Appl. No.: 12/834,085

(22) Filed: Jul. 12, 2010

(65) Prior Publication Data

US 2012/0007005 A1    Jan. 12, 2012

(51) Int. Cl.
 *G02B 27/00*      (2006.01)
(52) U.S. Cl.
 USPC ........................................................ 250/551

(58) Field of Classification Search
 USPC ............ 250/551; 385/33, 43, 92, 93, 94, 125, 385/133, 146
 See application file for complete search history.

(56) References Cited

U.S. PATENT DOCUMENTS

| | | | |
|---|---|---|---|
| 5,064,299 A * | 11/1991 | Hirschmann et al. | 385/33 |
| 5,181,264 A | 1/1993 | Chiaretti et al. | |
| 5,408,563 A | 4/1995 | Beland et al. | |
| 5,545,893 A * | 8/1996 | Brown et al. | 250/239 |
| 5,845,023 A | 12/1998 | Lee | |
| 5,990,475 A * | 11/1999 | Alegi | 250/239 |
| 6,272,269 B1 | 8/2001 | Naum | |
| 6,560,038 B1 | 5/2003 | Parkyn, Jr. et al. | |
| 6,971,804 B2 | 12/2005 | Lovato et al. | |
| 2009/0034909 A1* | 2/2009 | Mizumoto et al. | 385/42 |
| 2011/0105019 A1* | 5/2011 | Tavassoli Hozouri et al. | 455/39 |

* cited by examiner

*Primary Examiner* — Thanh Luu
*Assistant Examiner* — Renee Naphas (57) ABSTRACT

In an opto-isolator, a nontransparent hollow tube having a smooth inner surface with mirror-like qualities is used as the optical waveguide for coupling optical signals between the transmitter module and the receiver module and for providing electrical transient isolation.

17 Claims, 7 Drawing Sheets

OPTO-ISOLATOR THAT USES A NONTRANSPARENT HOLLOW TUBE AS THE OPTICAL WAVEGUIDE EXTENDING BETWEEN THE TRANSMITTER AND RECEIVER MODULES OF THE OPTO-ISOLATOR

TECHNICAL FIELD OF THE INVENTION

The invention relates to opto-isolators. More particularly, the invention relates to an opto-isolator that utilizes a nontransparent hollow tube having a smooth inner surface with mirror-like qualities to optically couple optical signals between the transmitter and receiver modules of the opto-isolator.

BACKGROUND OF THE INVENTION

An opto-isolator is a device that transfers a signal optically between two electrical circuits operating at different electrical potentials while, at the same time, electromagnetically isolating the circuits from each other. Opto-isolators also isolate one part of a system from electrical noise in another part of the system and protect circuits against damage from voltage surges. A transmitter module of the opto-isolator comprises an electrical-to-optical converter (EOC), such as a visible or infrared light emitting diode (LED), for example, that converts an electrical driver signal into an optical signal. A receiver module of the opto-isolator comprises an optical-to-electrical converter (OEC), such as a photodiode, for example, that converts the optical signal back into an electrical signal.

An optical waveguide optically couples the transmitter and receiver modules to each other to allow optical signals produced by the EOC of the transmitter module to be transmitted to the OEC of the receiver module. The optical waveguide is typically a length of optical fiber, but other optical waveguides are sometimes used for this purpose. For example, it is known to use an optically transmissive rod as the optical waveguide surrounded by a fluid having a refractive index that is different from the refractive index of the rod.

Although these types of optical waveguides generally work well at coupling optical signals between the transmitter and receiver modules while also providing electrical isolation, they are relatively costly to implement. A need exists for an opto-isolator that utilizes a less costly, yet optically efficient, optical waveguide for coupling optical signals between the transmitter and receiver modules of the opto-isolator while also providing sufficient electrical isolation.

SUMMARY OF THE INVENTION

The invention is directed to an opto-isolator and an opto-isolation method. The opto-isolator comprises a transmitter module housing, a transmitter module disposed within the transmitter module housing, a receiver module housing, a receiver module disposed within the receiver module housing, and a nontransparent hollow tube. The transmitter module has an EOC for converting an electrical drive signal into an optical signal. The nontransparent hollow tube has a first end and a second end and has inner and outer surfaces that define a wall of the hollow tube. The first end of the tube is mechanically coupled to the transmitter module housing. The inner surface of the tube is smooth and has mirror-like qualities. The optical signal produced by the EOC is optically coupled into the first end of the tube and propagates along the tube toward the second end of the tube via one or more reflections on the inner surface of the tube. The receiver module has an OEC for converting optical signals into electrical signals. At least a portion of the optical signal propagating along the tube toward the second end of the tube passes out of the second end of the tube and is optically coupled onto the OEC.

The method comprises the following. With an EOC, an electrical drive signal is converted into an optical signal. The optical signal is optically coupled into a first end of a nontransparent hollow tube. The nontransparent hollow tube has inner and outer surfaces that define a wall of the hollow tube. The inner surface of the tube is smooth and has mirror-like qualities. The optical signal propagates along the tube toward a second end of the tube via one or more reflections on the inner surface of the tube. The optical signal passing out of the second end of the nontransparent hollow tube is optically coupled onto an OEC. With the OEC, the optical signal coupled thereon is converted into an electrical signal.

These and other features and advantages of the invention will become apparent from the following description, drawings and claims.

DETAILED DESCRIPTION OF AN ILLUSTRATIVE EMBODIMENT

In accordance with the invention, an opto-isolator is provided that utilizes a nontransparent hollow tube having a smooth inner surface as the optical waveguide for coupling optical signals between a transmitter module and a receiver module of the opto-isolator. The optical waveguide may have a variety of configurations, as will now be described with reference to FIGS. 1-7.

Figure 1:
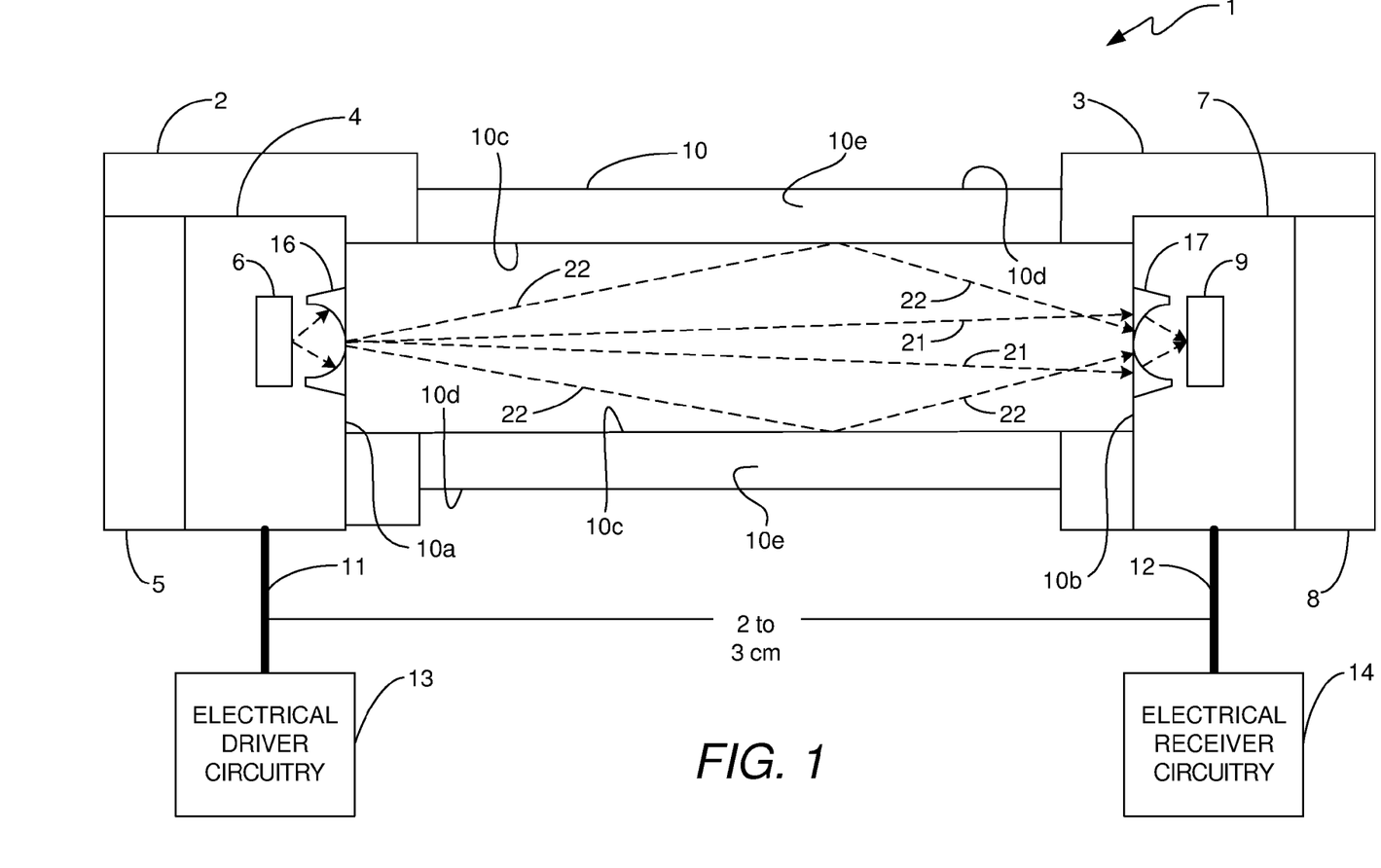
FIG. 1 illustrates a cross-sectional side view of the opto-isolator in accordance with an illustrative embodiment in which a hollow tube of the opto-isolator that acts as the optical waveguide has a constant diameter over the length of the tube.

FIG. 1 illustrates a cross-sectional side view of the opto-isolator 1 in accordance with an illustrative embodiment in which a hollow tube 10 of the opto-isolator 1 that acts as the optical waveguide has a constant diameter over the length of the tube 10. A transmitter module housing 2 and a receiver module housing 3 are optically coupled to one another by the hollow tube 10. In accordance with this illustrative embodiment, the transmitter module housing 2, the receiver module housing 3 and the hollow tube 10 are made of a single piece of molded polymer material. It should be noted, however, that the transmitter module housing 2, the receiver module housing 3 and the hollow tube 10 may be separate components made of the same or different materials.

The transmitter module housing 2 is disposed on a first end 10a of the hollow tube 10 and the receiver module housing 3 is disposed on a second end 10b of the hollow tube 10. A transmitter module 4 is held within the transmitter module housing 2 by a first clamp 5. The transmitter module 4 includes an EOC 6, such as a laser diode or a light emitting diode (LED), which converts an electrical signal into an optical signal for transmission over the hollow tube 10. A receiver module 7 is held within the receiver module housing 3 by a second clamp 8. The receiver module 7 includes an OEC 9, such as a photodiode, that converts the optical signal transmitted by the transmitter module 4 over the hollow tube 10 into an electrical signal. Although clamps 5 and 8 are specifically mentioned above as mechanisms that are used to secure the modules 4 and 7 within their respective housings 2 and 3, any mechanism or device may be used for this purpose, such as glue or epoxy, in which case the clamps 5 and 8 may be eliminated.

Electrical leads 11 connect the transmitter module 4 to electrical driver circuitry 13 of the opto-isolator 1. The electrical driver circuitry 13 produces the electrical signals that drive the EOC 6. Electrical leads 12 connect the receiver module 7 to electrical receiver circuitry 14 of the opto-isolator 1. The electrical receiver circuitry 14 processes the electrical signals produced by the OEC 9. The distance between the electrical leads 11 and 12 is typically about 2 to 3 centimeters (cm). Thus, the hollow tube 10 has an end-to-end length that is less than about 3 cm. The opto-isolator 1 is particularly well suited for use in very short optical links in which high isolation in the kilovolt (kV) range is needed.

The hollow tube 10 has an inner surface 10c and an outer surface 10d that define the tube wall 10e. In accordance with this illustrative embodiment, the inner surface 10c has a constant diameter over the length of the tube 10 from the first end 10a to the second end 10b. The inner surface 10c of the tube 10 is very smooth and has a roughness that is generally not more than about $\frac{1}{10}\lambda$, where $\lambda$ is the wavelength of light being transmitted by the EOC 6 of the transmitter module 4. The inner surface 10c of the hollow tube 10 is made smooth through the use of a lapped and honed mold tool surface in this area that gives the inner surface 10c smooth, mirror-like qualities. In addition, the hollow tube 10 is nontransparent to prevent external light produced by sources external to the opto-isolator 1 from passing through the outer and inner surfaces 10d and 10c, respectively, and entering into the hollow tube 10. This feature ensures that only light produced by the EOC 6 will be received by the OEC 9.

In accordance with this illustrative embodiment, lenses 16 and 17 are integrated into the transmitter and receiver modules 4 and 7, respectively. The lenses 16 and 17 do not have to be integrated with the modules 4 and 7, respectively, but may be separate components that are mechanically coupled to the respective modules 4 and 7. Light produced by the EOC 6 is coupled by the lens 16 into the end 10a of the hollow tube 10. Some of this light, which is represented by dashed lines 21, passes through the tube 10 to the second end 10b of the tube 10 without being incident on the inner surface 10c of the tube 10. As the light 21 passes through the end 10b of the tube 10, it is coupled by the lens 17 onto the OEC 9. On the other hand, some of the light, which is represented by arrows 22, is incident on the inner surface 10c of the tube 10, as will now be described with reference to FIG. 2.

Figure 2:
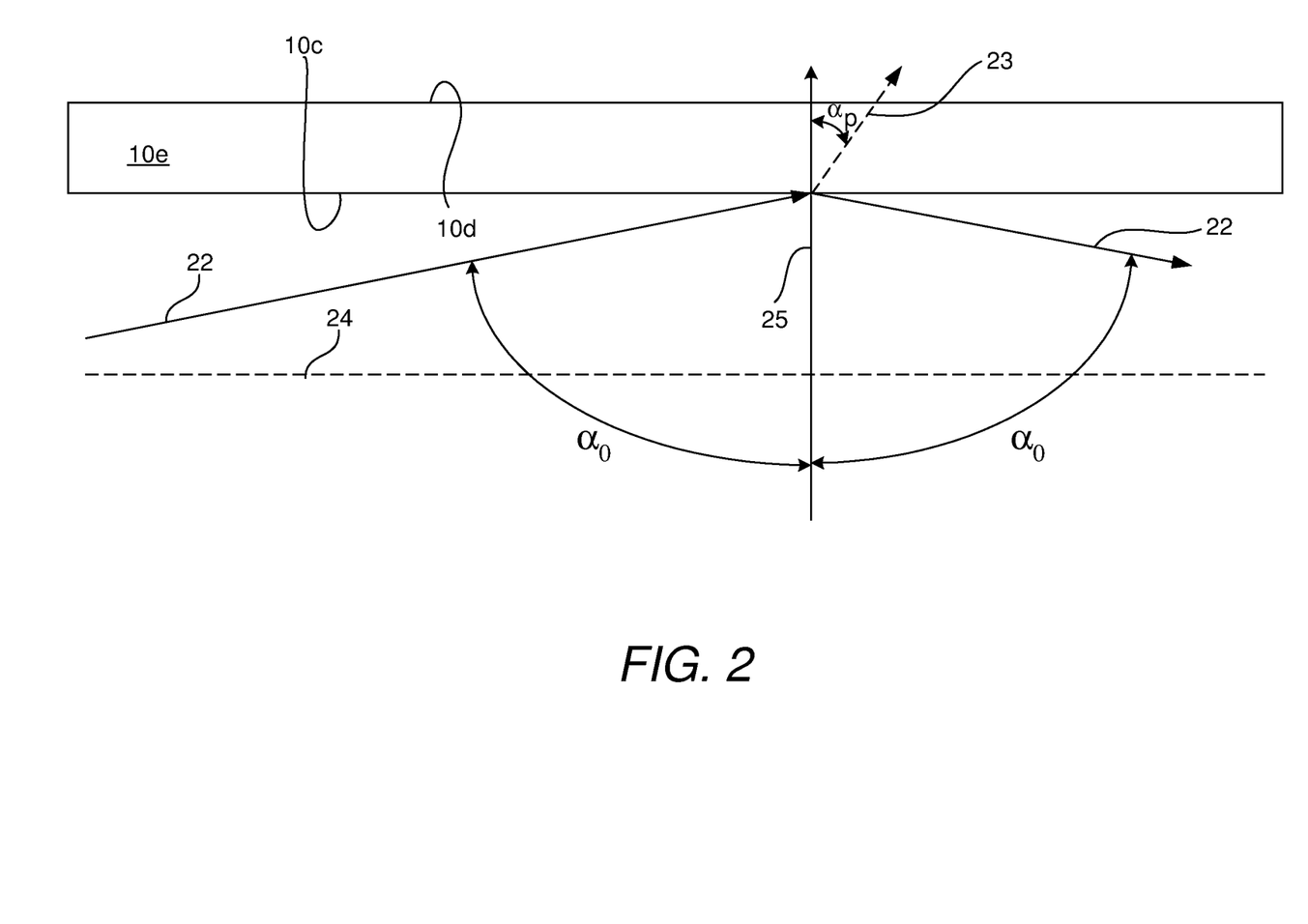
FIG. 2 illustrates a cross-sectional side view of a portion of the tube wall of the opto-isolator shown in FIG. 1, which demonstrates the manner in which light that is incident on the inner surface of the hollow tube is reflected or refracted.

FIG. 2 illustrates a cross-sectional side view of a portion of the tube wall 10e, which demonstrates the manner in which light 22 that is incident on the inner surface 10c of the tube 10 is reflected or refracted. The angle of incidence of the light on the inner surface 10e is represented by the symbol $\alpha_O$, which is the angle between the ray represented by line 22 and a normal 25 to the optical axis 24 of the tube 10. The smoothness and mirror-like qualities of the inner surface 10c of the tube 10 will ensure that most of this incident light 22 is reflected at the inner surface 10c in accordance with well known Fresnel equations. In general, because the coefficient of refraction of the material of which the tube 10 is made (e.g., polymer) is higher than the coefficient of refraction of the air that fills the hollow tube 10, most of the light 22 that is incident on the inner surface 10c of the tube 10 is reflected by the inner surface 10c before being coupled by the lens 17 onto the OEC 9. The configuration of the lens 16 and the length of the tube 10 can be selected to minimize the number of reflections that occur such that optical power is concentrated around the area on the second end 10b where the lens 17 is located in order to improve optical efficiency.

Some of the light that is incident on the inner surface 10c of the tube 10 is not reflected, but rather, is refracted into the tube wall 10e. The amount of light 23 that is refracted into the tube wall 10e depends on the angle of incidence, $\alpha_O$. The angle of reflection, $\alpha_O$, is equal to the angle of incidence, $\alpha_O$. As the angle of incidence $\alpha_O$ decreases, more light 23 is refracted into the tube wall 10e. Conversely, as the angle of incidence $\alpha_O$ increases, less light 23 is refracted into the tube wall 10e and more of the light 22 is reflected by the inner surface 10c. The angle of refraction, $\alpha_P$, represents the angle of the light 23 relative to a normal 25. Because the tube wall 10e is nontransparent, most if not all of the refracted light 23 is absorbed by the tube wall 10e. The tube wall 10e can be made to be nontransparent in a number of ways, such as, for example, through the use of a pigment in the molded material.

Figure 3:
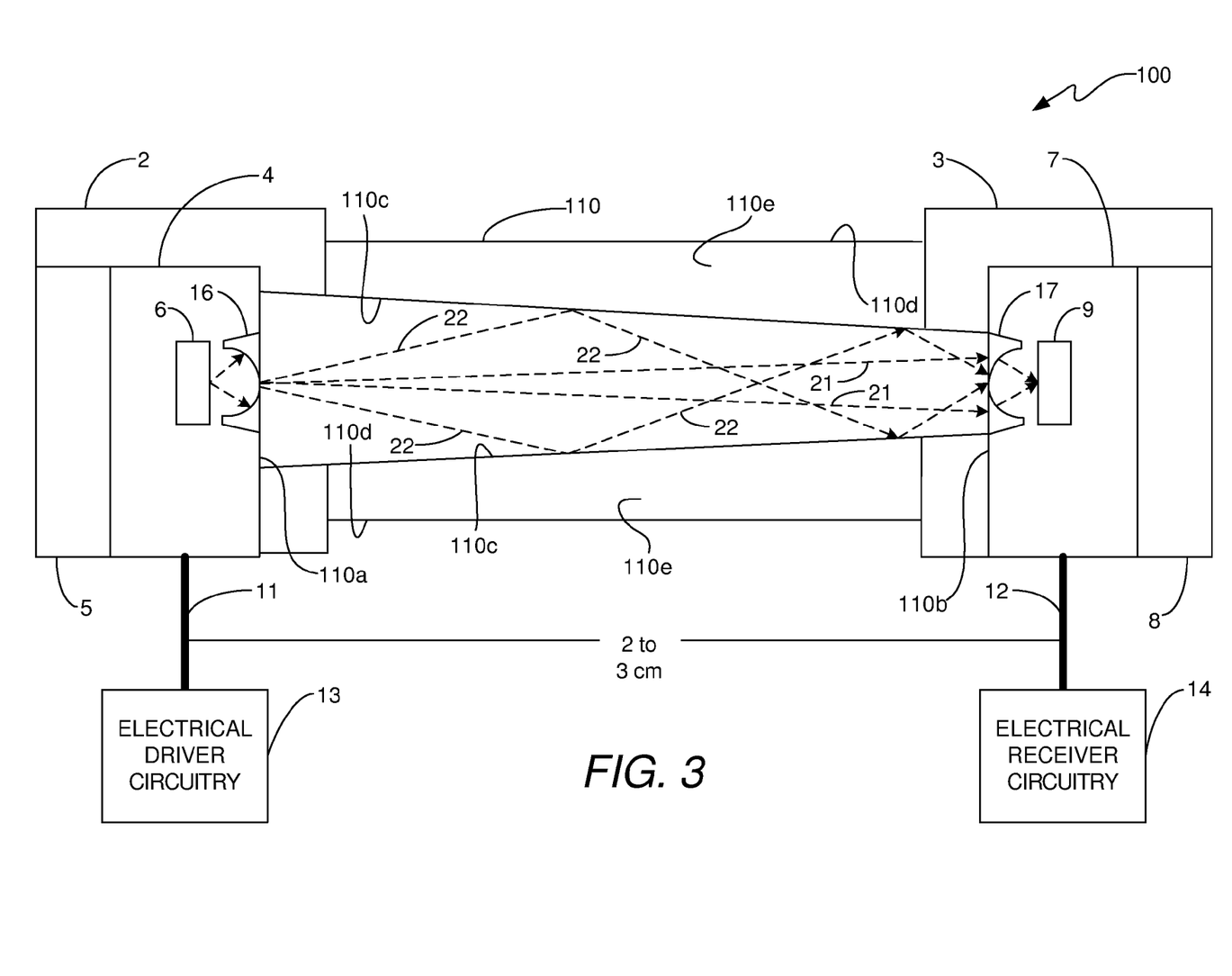
FIG. 3 illustrates a cross-sectional side view of the opto-isolator in accordance with another illustrative embodiment in which the hollow tube of the opto-isolator has a diameter that is linearly tapered over the length of the tube from a first end of the tube to a second end of the tube.

FIG. 3 illustrates a cross-sectional side view of the opto-isolator 100 in accordance with another illustrative embodiment in which the hollow tube 110 of the opto-isolator 100 has a diameter that is linearly tapered over the length of the tube 110 from a first end 110a of the tube 110 to a second end 110b of the tube 110. Identical components in FIGS. 1 and 3 are represented by the same reference numerals. Like the hollow tube 10 shown in FIG. 1, the hollow tube 110 shown in FIG. 3 has an inner surface 110c and an outer surface 110d that define a tube wall 110e. In accordance with this illustrative embodiment, the inner surface 110c has a diameter that is linearly tapered over the length of the tube 110 from the first end 110a to the second end 110b such that the diameter of the hollow tube 110 at the second end 110b is smaller than the diameter of the hollow tube 110 at the first end 110a. The inner surface 110c of the tube 110 is very smooth and has a roughness that is generally not more than about $\frac{1}{10}\lambda$. As indicated above, the inner surface 110c of the hollow tube 110 is made smooth during the molding process through the use of a lapping and honing process that gives the inner surface 110c mirror-like qualities.

The primary difference between the embodiments shown in FIGS. 1 and 3 is that the linear tapering of the diameter of the hollow tube 110 causes more of the optical energy produced by the EOC 6 to be directed into the small area at the second end 110b of the tube 110 at which the lens 17 is located, which, in turn, causes more optical power to be coupled by the lens 17 onto the OEC 9. Thus, the linear tapering of the tube 10 can result in improved optical efficiency.

Figure 4:
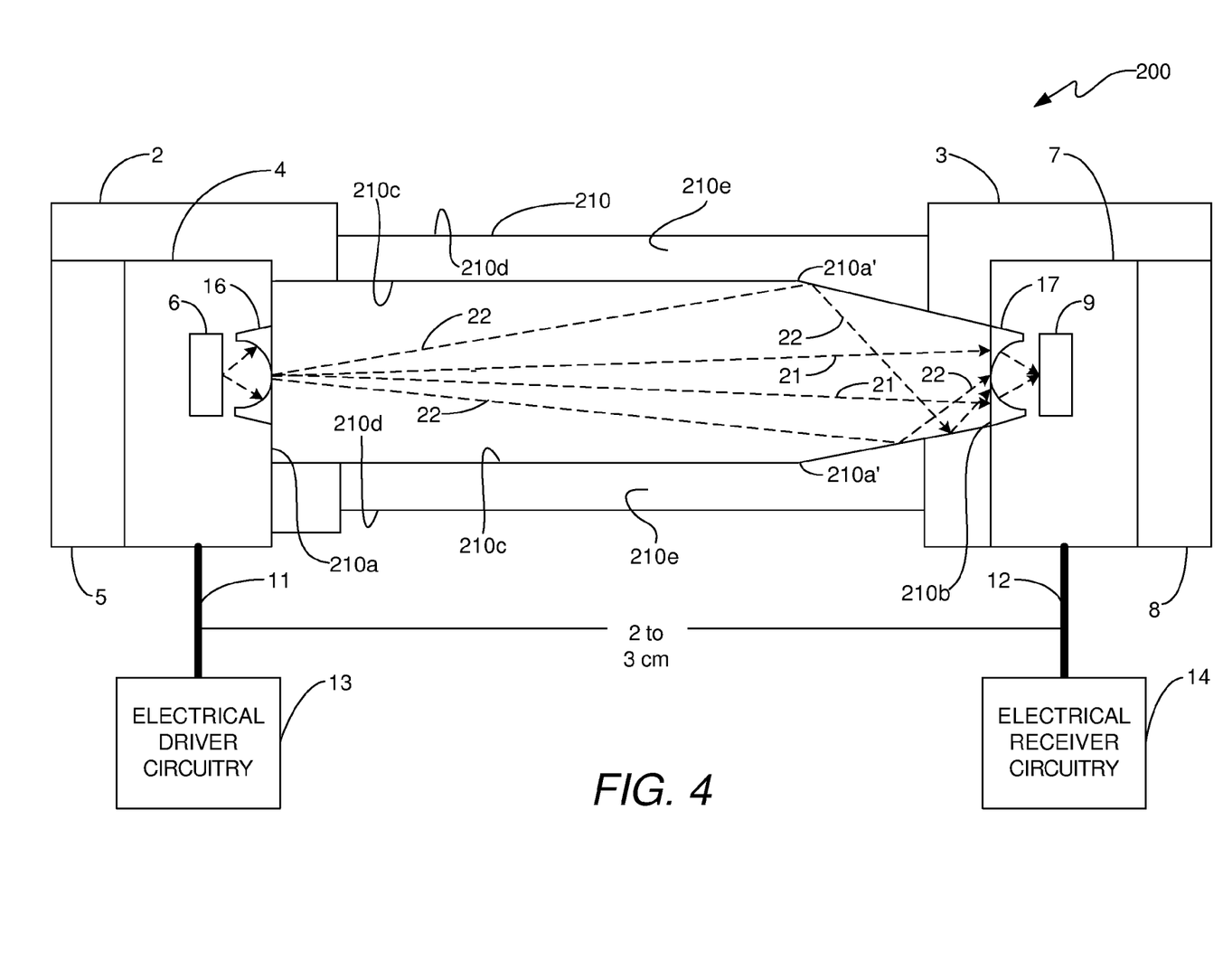
FIG. 4 illustrates a cross-sectional side view of the opto-isolator in accordance with another illustrative embodiment in which the hollow tube of the opto-isolator has a diameter that is constant over a portion of the length of the tube and then linearly tapered over a portion of the length of the tube.

FIG. 4 illustrates a cross-sectional side view of the opto-isolator 200 in accordance with another illustrative embodiment in which the hollow tube 210 of the opto-isolator 200 has a diameter that is constant over a portion of the length of the tube 210 and then linearly tapered over a portion of the length of the tube 210. Identical components in FIGS. 1, 3 and 4 are represented by the same reference numerals. Like the hollow tube 10 shown in FIG. 1, the hollow tube 210 shown in FIG. 4 has an inner surface 210c and an outer surface 210d that define a tube wall 210e. In accordance with this illustrative embodiment, the inner surface 210c has a diameter that is constant over the portion of the tube 210 extending from the first end 210a to a location 210a' that is nearer the end 210b than to the end 210a. From the location 210a' to the second end 210b, the diameter of the inner surface 210c is linearly tapered. As with the embodiments described above with reference to FIGS. 1 and 3, the inner surface 210c of the tube 210 is very smooth with mirror-like qualities and has a roughness that is generally not more than about $1/10\lambda$.

In the portion of the tube 210 where the diameter of the inner surface 210c is constant, the angles of incidence and reflection are equal, and the light is conducted through the tube 210 in the same manner in which light is conducted through the tube 10 shown in FIG. 1. In the portion of the tube 210 where the diameter of the inner surface 210c is linearly tapered, the angles of reflection are less than the angles of incidence. In other words, the angles of reflection are reduced by the tilt angle of the inner surface 210c in the tapered portion of the tube 210 relative to the optical axis of the tube 210. This causes the reflected light in the tapered portion to be reflected at increasingly steeper angles, which, in turn, causes more of the optical energy produced by the EOC 6 to be directed into the small area at the second end 210b of the tube 210 at which the lens 17 is located. Thus, more optical power is coupled by the lens 17 onto the OEC 9, which can result in improved optical efficiency.

Figure 5:
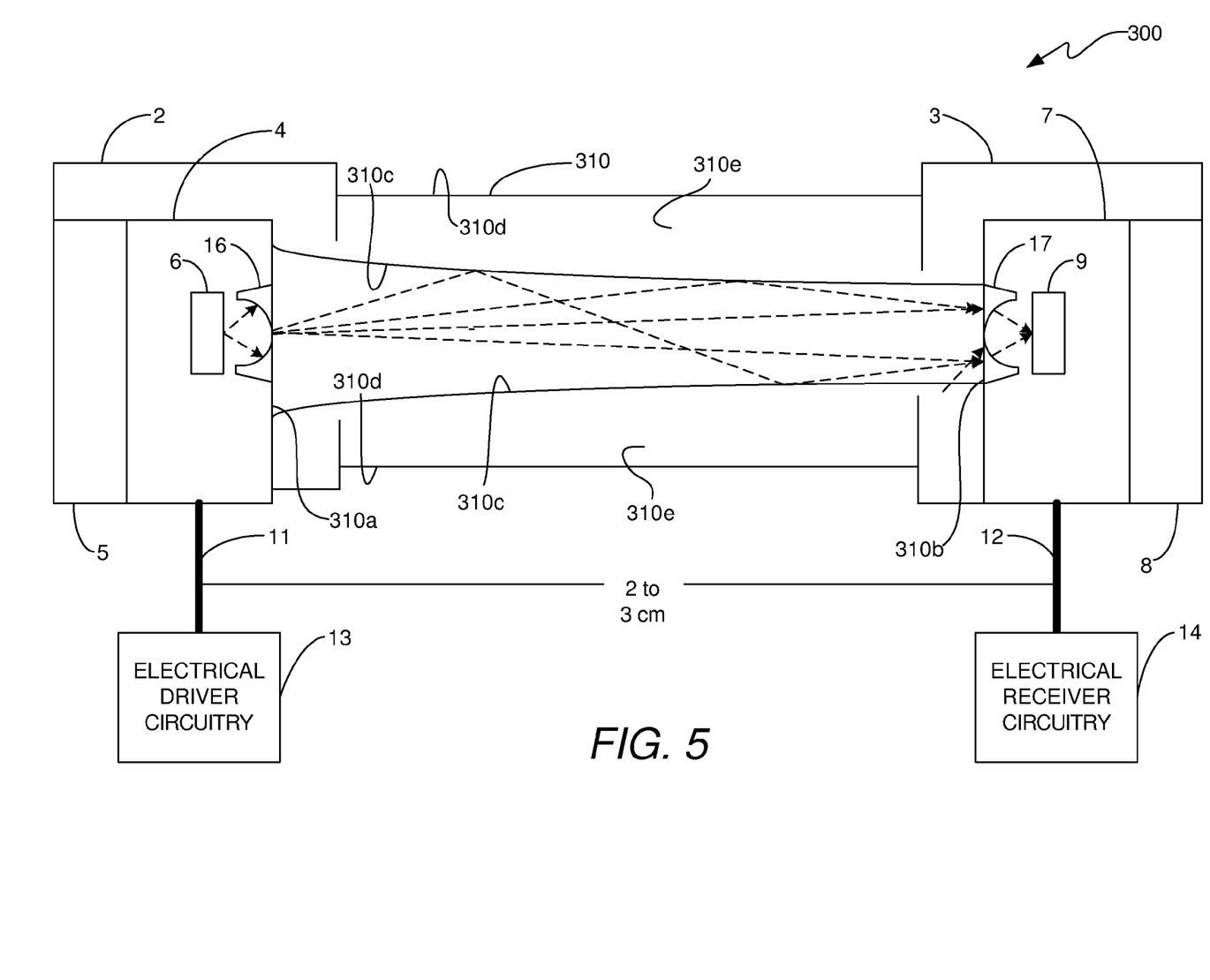
FIG. 5 illustrates a cross-sectional side view of the opto-isolator in accordance with another illustrative embodiment in which the hollow tube of the opto-isolator has a diameter that is parabolically tapered over the length of the tube.

FIG. 5 illustrates a cross-sectional side view of the opto-isolator 300 in accordance with another illustrative embodiment in which the hollow tube 310 of the opto-isolator 300 has a diameter that is parabolically tapered over the length of the tube 310. Identical components in FIGS. 1, 3, 4 and 5 are represented by the same reference numerals. Like the hollow tube 10 shown in FIG. 1, the hollow tube 310 shown in FIG. 5 has an inner surface 310c and an outer surface 310d that define a tube wall 310e. In accordance with this illustrative embodiment, the shape of the inner surface 310c of the tube 310 is defined by the equation of a parabola. As with the embodiments described above with reference to FIGS. 1, 3 and 4, the inner surface 310c of the tube 310 is very smooth with mirror-like qualities and has a roughness that is generally not more than about $1/10\lambda$.

The parabolically tapered inner surface 310c has decreased reflectivity near the end 310a of the tube 310, but increased reflectivity near the end 310b of the tube 310. The smaller diameter of the inner surface 310c near the end 310b causes more optical energy to be directed into the small area at the second end 310b of the tube 310 at which the lens 17 is located.

Figure 6:
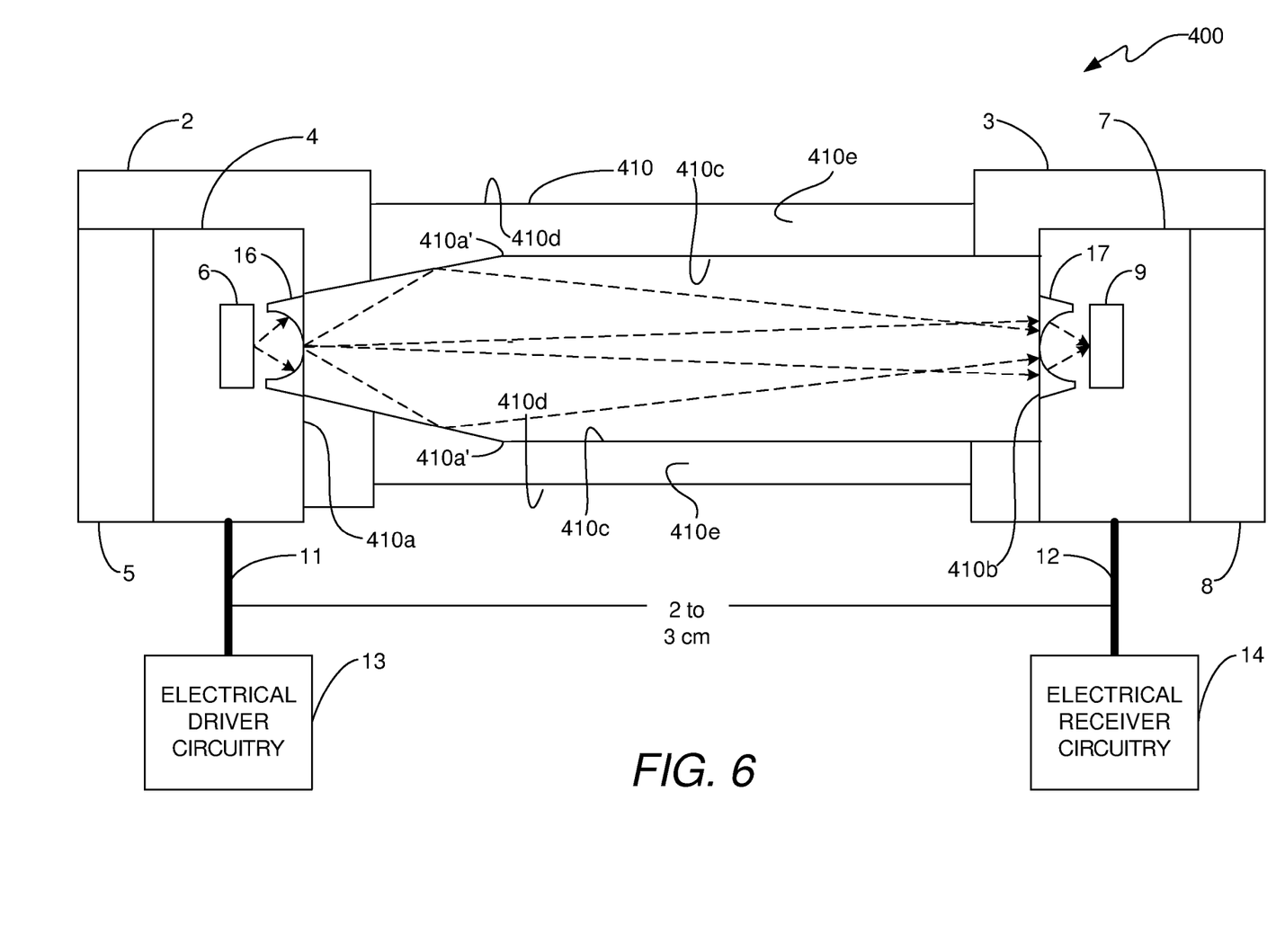
FIG. 6 illustrates a cross-sectional side view of the opto-isolator in accordance with another illustrative embodiment in which the hollow tube of the opto-isolator has a diameter that is linearly tapered over a portion of the length of the tube and that is constant over the remaining portion of the length of the tube.

FIG. 6 illustrates a cross-sectional side view of the opto-isolator 400 in accordance with another illustrative embodiment in which the hollow tube 410 of the opto-isolator 400 is linearly tapered over a portion of the length of the tube 410 and has a diameter that is constant over the remaining portion of the length of the tube 410. Identical components in FIGS. 1, 3, 4, 5, and 6 are represented by the same reference numerals. Like the hollow tube 10 shown in FIG. 1, the hollow tube 410 shown in FIG. 6 has an inner surface 410c and an outer surface 410d that define a tube wall 410e. In accordance with this illustrative embodiment, the inner surface 410c has a diameter that is linearly tapered over the portion of the tube 410 extending from the first end 410a to a location 410a' that is nearer the first end 410a than to the second end 410b. From the location 410a' to the second end 410b, the diameter of the inner surface 210c is constant. As with the embodiments described above with reference to FIGS. 1, 3, 4, and 5, the inner surface 410c of the tube 410 is very smooth with mirror-like qualities and has a roughness that is generally not more than about $1/10\lambda$.

In the portion of the tube 410 where the diameter of the inner surface 410c is linearly tapered, the angles of reflection are greater than the angles of incidence. In other words, the angles of reflection are increased by the tilt angle of the inner surface 410c in the tapered portion of the tube 410 relative to the optical axis of the tube 410. This increase in the angle of reflection in the tapered portion causes the reflected light rays to be flattened out such that they are directed into the small area on the second end 410b of the tube 410 adjacent the lens 17. This causes more of the optical power produced by the EOC 6 to be coupled by the lens 17 onto the OEC 9, which can result in improved optical efficiency. In the portion of the tube 410 where the diameter of the inner surface 410c is constant, the angles of incidence and reflection are equal, and the light is conducted through the tube 410 in the same manner in which light is conducted through the tube 10 shown in FIG. 1.

Figure 7:
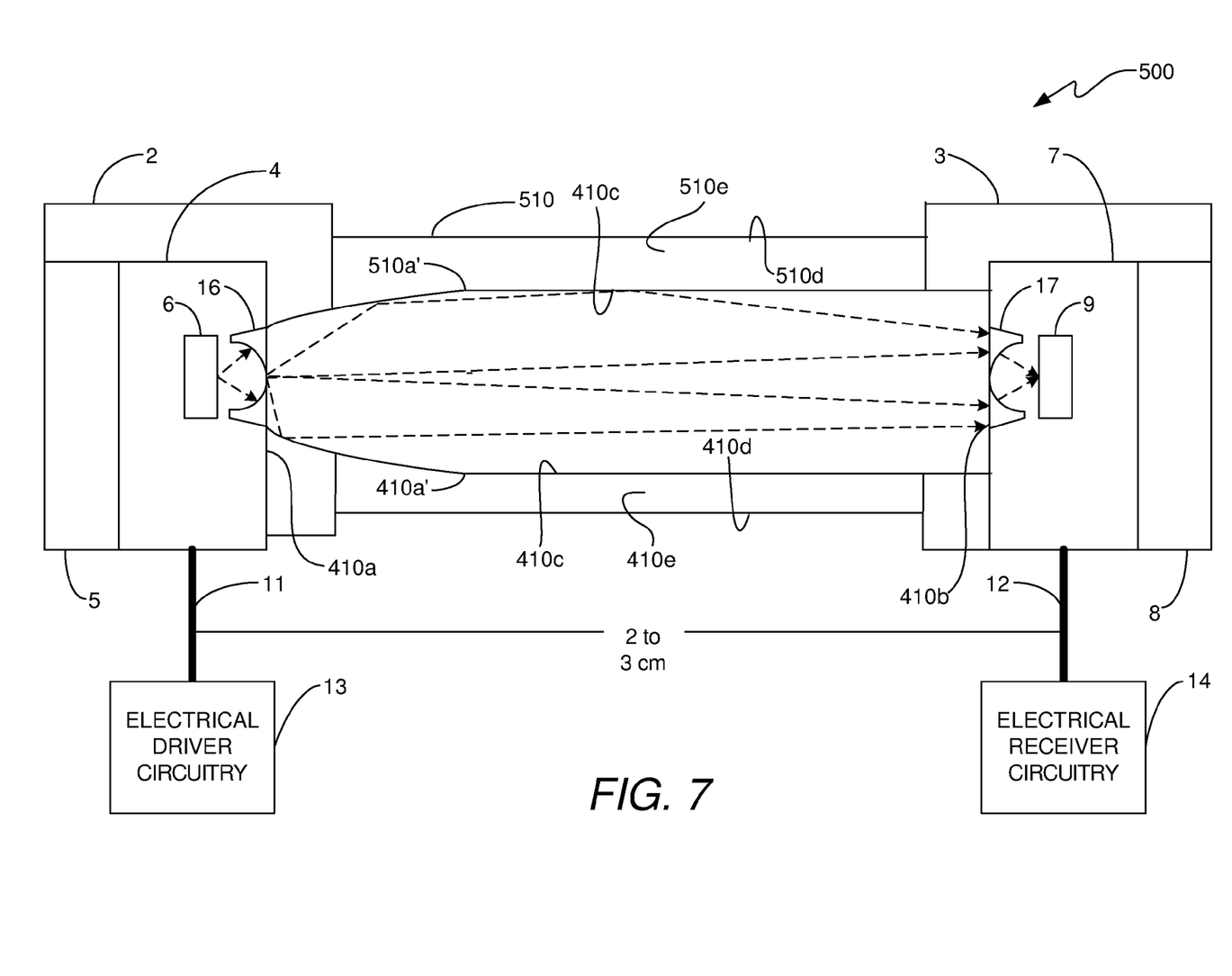
FIG. 7 illustrates a cross-sectional side view of the opto-isolator in accordance with another illustrative embodiment in which the hollow tube of the opto-isolator has a diameter that is parabolically tapered over a portion of the length of the tube and that is constant over the remaining portion of the length of the tube.

FIG. 7 illustrates a cross-sectional side view of the opto-isolator 500 in accordance with another illustrative embodiment in which the hollow tube 510 of the opto-isolator 500 is parabolically tapered over a portion of the length of the tube 510 and has a diameter that is constant over the remaining portion of the length of the tube 510. Identical components in FIGS. 1, 3, 4, 5, 6, and 7 are represented by the same reference numerals. Like the hollow tube 10 shown in FIG. 1, the hollow tube 510 shown in FIG. 7 has an inner surface 510c and an outer surface 510d that define a tube wall 510e. In accordance with this illustrative embodiment, the inner surface 510c has a diameter that is parabolically tapered over the portion of the tube 510 extending from the first end 510a to a location 510a' that is nearer the first end 510a than to the second end 510b. From the location 510a' to the second end 510b, the diameter of the inner surface 510c is constant. As with the embodiments described above with reference to FIGS. 1, 3, 4, 5, and 6, the inner surface 510c of the tube 510 is very smooth and has a roughness that is generally not more than about $1/10\lambda$.

In the portion of the tube 510 where the diameter of the inner surface 510c is parabolically tapered, the angles of reflection are greater than the angles of incidence. In other words, the angles of reflection are increased by the tilt angle of the inner surface 510c in the tapered portion of the tube 510 relative to the optical axis of the tube 410. Because of the parabolic shape of the inner surface 510c in the tapered portion of the tube 510, the tilt angle gradually changes along the tapered portion as the distance from the first end 510a increases. The angle of reflection is increased by the tilt angle in the tapered portion, and thus the angle of reflection varies with variations in the tilt angle along the tapered portion. This change in the angle of reflection in the tapered portion causes the reflected light rays to be flattened out such that they are directed into the small area on the second end 510b of the tube 510 adjacent the lens 17. This causes more of the optical power produced by the EOC 6 to be coupled by the lens 17 onto the OEC 9, which can result in improved optical efficiency. In the portion of the tube 510 where the diameter of the inner surface 510c is constant, the angles of incidence and reflection are equal, and the light is conducted through the tube 510 in the same manner in which light is conducted through the tube 10 shown in FIG. 1.

As indicated above with reference to FIGS. 1 and 3-7, the distance between the leads 11 and 12 is typically 2 to 3 cm, and the length of the hollow tube is slightly less than this distance. Thus, the overall length of the opto-isolator is relatively short. This distance, and thus the length of the opto-isolator, are chosen to provide an electrical separation between the transmitter and receiver modules that will work at isolating high transient voltages, e.g., transient voltages of about 12 kV and greater. A distance of about 22 millimeters (mm) will generally be sufficient to provide transient voltage isolation for 12 kV. The maximum distance is limited by the amount of optical power that needs to be received at the OEC 9 and by the bit rate, which may be 200 megabits per second (Mb/s), for example, and higher (e.g., up to 500 Mb/s for a LED due to the fact that the photodiode area is then very small). If a vertical cavity surface emitting laser diode (VCSEL) is used as the EOC 6, then the distance will be larger and the bit rate may be up to 10 Gb/s. Often, the distance and length limitations are based on the available space on a printed circuit board (PCB) or other mounting surface.

As indicated above, the hollow tube is typically made of a molded plastic material, and thus is very inexpensive to manufacture. This feature provides a significant cost savings over other types of opto-isolators that use optical fibers or rods surrounded by fluids as the optical waveguides. This cost savings is important, especially in cases where only very short optical links are needed and there is no need to use more expensive waveguides, such as optical fibers, which require expensive and time-consuming affixing and alignment processes. The opto-isolator of the invention provides an inexpensive and optically robust solution that is well suited for short optical links.

It should be noted that the invention has been described with reference to illustrative embodiments for the purpose of demonstrating the principles and concepts of the invention. The invention is not limited to these embodiments, as will be understood by those skilled in the art in view of the description provided herein. Other variations and modifications may be made to the embodiments described herein, as will be understood by those skilled in the art, and such modifications and variations are within the scope of the invention.

What is claimed is:

1. An opto-isolator comprising:
    a transmitter module housing;
    a transmitter module disposed within the transmitter module housing, the transmitter module having an electrical-to-optical converter (EOC) for converting an electrical drive signal into an optical signal;
    a nontransparent hollow tube, the tube having a diameter D and being formed of a polymer material, the tube having a first end and a second end and having inner and outer surfaces that define a wall of the tube between the first end and the second end where the wall has a length L, the first end of the tube being mechanically coupled to an outer surface of the transmitter module housing, the inner surface of the tube being smooth and having minor-like qualities, the optical signal produced by the EOC being optically coupled into the first end of the tube and the optical signal propagating along the tube toward the second end of the tube via one or more reflections on the inner surface of the tube, wherein the length L is greater than diameter D, wherein the diameter D of the tube comprises a diameter of the outer surface of the tube, and a second diameter D2 comprises a diameter of the inner surface, and wherein the second diameter D2 at the first end of the tube is greater than the second diameter D2 at the second end of the tube;
    a receiver module housing, wherein the second end of the tube is mechanically coupled to an outer surface of the receiver module housing; and
    a receiver module disposed within the receiver module housing, the receiver module having an optical-to-electrical converter (OEC) for converting optical signals into electrical signals, wherein at least a portion of the optical signal propagating along the tube toward the second end of the tube passes out of the second end of the tube and is optically coupled onto the OEC.

2. The opto-isolator of claim 1, further comprising:
    a first lens in the transmitter module for optically coupling the optical signal produced by the EOC into the first end of the nontransparent hollow tube; and
    a second lens in the receiver module for optically coupling said at least a portion of the optical signal passing out of the second end of the tube onto the OEC.

3. The opto-isolator of claim 2, wherein the nontransparent hollow tube has a length that is less than or equal to about 3 centimeters (cm).

4. The opto-isolator of claim 2, wherein the first lens is integrally formed in the transmitter module housing and wherein the second lens is integrally formed in the receiver module housing.

5. The opto-isolator of claim 3, wherein the opto-isolator is capable of providing isolation for transient voltages greater than 1.0 kilovolts (kV).

6. The opto-isolator of claim 5, wherein the opto-isolator is capable of providing isolation for transient voltages of at least 12.0 kilovolts (kV).

7. The opto-isolator of claim 1, wherein the second diameter D2 of the inner surface of the tube forms a linear taper from the first end of the tube to the send end of the tube.

8. The opto-isolator of claim 1, wherein the second diameter D2 of the inner surface of the tube forms a parabolic taper from the first end of the tube to the send end of the tube.

9. A method for performing opto-isolation in an opto-isolator, the method comprising:
    with an electrical-to-optical converter (EOC), converting an electrical drive signal into an optical signal;
    sending the optical signal into a first end of a nontransparent hollow tube detachable from a housing for the EOC, the tube being formed of a polymer material, the tube having a diameter D, a first end and a second end, and inner and outer surfaces that define a wall of the hollow tube between the first end and second end of length L, wherein the length L is greater than the diameter D, the inner surface of the tube being smooth and having mirror-like qualities, wherein the first end of the tube is mechanically coupled to an outer surface of a housing for the EOC the optical signal propagates along the tube toward a second end of the tube via one or more reflections on the inner surface of the tube, wherein the diameter D of the tube comprises a diameter of the outer surface of the tube, and a second diameter D2 comprises a diameter of the inner surface, and wherein the second diameter D2 at the first end of the tube is greater than the second diameter D2 at the second end of the tube;

receiving an optical signal passing from the second end of the tube onto an optical-to-electrical converter (OEC), wherein the second end of the tube is mechanically coupled to an outer surface of a housing for the OEC; and with the OEC, converting the optical signal received thereon to an electrical signal.

10. The method of claim 9, wherein the nontransparent hollow tube has a length that is less than or equal to about 3 centimeters (cm).

11. The method of claim 10, wherein the opto-isolator is capable of providing isolation for transient voltages greater than 1.0 kilovolts (kV).

12. The method of claim 11, wherein the opto-isolator is capable of providing isolation for transient voltages of at least 12.0 kilovolts (kV).

13. The method of claim 9, wherein sending the optical signal into the first end of the separate nontransparent hollow tube further comprises sending the optical signal from the EOC to a first lens, the first lens configured to optically couple the optical signal produced by the EOC into the first end of the nontransparent hollow tube.

14. The method of claim 9, wherein receiving the optical signal passing from the second end of the tube onto the OEC further comprises receiving the optical signal at a second lens, the second lens configured to optically couple at least a portion of the optical signal passing out of the second end of the tube onto the OEC.

15. An opto-isolator comprising:
a transmitter module housing;
a transmitter module disposed within the transmitter module housing, the transmitter module having an electrical-to-optical converter (EOC) for converting an electrical drive signal into an optical signal;
a nontransparent hollow tube, the tube having a diameter D and being formed of a polymer material, the tube having a first end and a second end and having inner and outer surfaces that define a wall of the tube between the first end and the second end where the wall has a length L, the first end of the tube being mechanically coupled to an outer surface of the transmitter module housing, the inner surface of the tube being smooth and having minor-like qualities, the optical signal produced by the EOC being optically coupled into the first end of the tube and the optical signal propagating along the tube toward the second end of the tube via one or more reflections on the inner surface of the tube, wherein the length L is greater than diameter D, wherein the diameter D of the tube comprises a diameter of the outer surface of the tube, and a second diameter D2 comprises a diameter of the inner surface, and wherein the second diameter D2 at the second end of the tube is greater than the second diameter D2 at the first end of the tube;
a receiver module housing, wherein the second end of the tube is mechanically coupled to an outer surface of the receiver module housing; and
a receiver module disposed within the receiver module housing, the receiver module having an optical-to-electrical converter (OEC) for converting optical signals into electrical signals, wherein at least a portion of the optical signal propagating along the tube toward the second end of the tube passes out of the second end of the tube and is optically coupled onto the OEC.

16. The opto-isolator of claim 15, wherein at least a portion of the second diameter D2 of the inner surface of the tube forms a linear taper from the second end of the tube to the first end of the tube.

17. The opto-isolator of claim 15, wherein at least a portion of the second diameter D2 of the inner surface of the tube forms an elliptical taper from the second end of the tube to the first end of the tube.

\* \* \* \* \*